United States Patent [19]
Chang

[11] Patent Number: 5,990,565
[45] Date of Patent: Nov. 23, 1999

[54] FLIP CHIP PACKAGE

[76] Inventor: Meilien Chang, 7F, No. 22, San Chung Rd., Chu Tung Town, Hsinchu Hsien, Taiwan

[21] Appl. No.: 09/179,905

[22] Filed: Oct. 28, 1998

[51] Int. Cl.⁶ .................................................. H01L 23/49
[52] U.S. Cl. ......................... 257/778; 257/779; 257/780; 257/678; 257/687
[58] Field of Search ...................... 257/678, 687, 257/692, 706, 707, 708, 675, 676, 778, 779, 780, 787, 789, 737, 784; 361/707; 438/108, 112, 122, 124

[56] References Cited

U.S. PATENT DOCUMENTS

| | | | |
|---|---|---|---|
| 5,285,352 | 2/1994 | Pastore et al. | 361/707 |
| 5,412,247 | 5/1995 | Martin | 257/678 |
| 5,530,286 | 6/1996 | Murakami | 257/692 |
| 5,583,375 | 12/1996 | Tsubosaki et al. | 257/692 |
| 5,677,566 | 10/1997 | King et al. | 257/666 |
| 5,739,585 | 4/1998 | Akram et al. | 257/698 |
| 5,793,104 | 8/1998 | Kirkman | 257/692 |

Primary Examiner—Tom Thomas
Assistant Examiner—Luan Thai
Attorney, Agent, or Firm—Rosenberg, Klein & Bilker

[57] ABSTRACT

The invention is related to a new technology for improving a flip chip package. It is characterized by that at least one pad and at least one lead are formed on the surface of one side of a chip, part of each lead is covered by liquid compound and whereby another part of said lead which is exposed beyond the surface of said liquid compound is available for electrical connection. According to the invention, wire bonding can be easily applied in forming leads for flip chip package, and better connection structure can be achieved, thereby the manufacturing process of integrating the chip and printed circuit board becomes easy. Furthermore the pad on the surface of the chip is thermally conductive, helping the conduction of heat from the chip to the printed circuit board, thereby promotes the effect of protecting the chip.

11 Claims, 7 Drawing Sheets

FLIP CHIP PACKAGE

FIELD OF THE INVENTION

The invention generally relates to a flip chip package, and particularly to leads structure of chips of semiconductor IC (integrated circuits).

BACKGROUND OF THE INVENTION

The progress in the manufacturing process of a semiconductor and the trend in promoting circuit function of chips have fostered circumstances of providing highly condensed IC accompanied with enormously increased input/output connection points, resulting in problems in packaging an IC chip and further difficulties in integrating chips and printed circuit boards. Various schemes have been suggested to provide solutions to these problems and difficulties, among which flip chip package has broadly drawn attention.

A conventional flip chip package is shown in FIG. 1 in which bumps or solders are formed, on the surface of one side of chip 10, as connection points 12, and corresponding bonding pad is formed on the surface of printed circuit board 14 for being welded with connection points 12.

There are many drawbacks with the above flip chip package, among which one is the indispensable requirement of higher accuracy in forming connection point 12 to avoid short circuiting or breaking in the process next to (or after) the formation of connection point 12. The short circuiting is usually caused by the excessive length of connection point 12 which, in case of being bent, tend to touch each other or another circuits. The breaking of connection point 12 results from weak resistance to external forces due to weak connecting structure between connection point 12 and chip 10. For example, the error in the alignment between connection point 12 and bonding pad on the surface of printed circuit board 14 may result in a breaking of connection point 12 caused by the dragging force inherent in welding process.

Another drawback with the above flip chip package is that the difference in coefficient of thermal expansion between chip 10 and printed circuit board 14 may be big enough to bring about different expansion between them due to temperature variation in the following manufacturing process, resulting in breaking of connections.

An improvement scheme had been suggested by conventional technology in which under-fill 16 is added between chip 10 and printed circuit board 14 after they are connected. The under-fill 16 is a kind of resin such as epoxy. However, the gap between chip 10 and printed circuit board 14 is usually so narrow that it is impossible to force epoxy resin into the gap by molding transfer process. Instead, epoxy resin must be painted around the edge of chip 10, thereby penetrate, based on capillary action, into the gap between chip 10 and printed circuit board. The scheme is accompanied with enormous time consuming, and can't control or detect the extent to which the epoxy resin penetrate into the gap, and may easily produce air bubbles. Another drawback is that reworking is not feasible afterwards.

It is critically important to choose a kind of material with less viscosity, in order to enable the flowing of epoxy resin into the gap between chip 10 and printed circuit board 14. However, material with less viscosity is usually less thermally conductive, thereby can't effectively help chip 10 to dissipate heat.

Therefore solutions to the problems and difficulties left by conventional schemes for improving flip chip package are now suggested by the present invention.

SUMMARY OF THE INVENTION

The primary object of the invention is to provide a new flip chip package for easier integration of chips and printed circuit board.

One of the features of the invention is to form leads for flip chip package by taking advantage of conventional wire bonding technology.

The other objects of the invention are:
1. to provide a better flip chip structure for protecting chip leads which usually tend to be short circuited when in a bent shape;
2. to provide a better flip chip package in which the length of chip leads can be easily controlled;
3. to provide a better flip chip package in which the heat dissipation of chip can be improved; and
4. to provide a better flip chip package in which chips are protected by frames.

The above objects are realized by the invention through adopting silver filled epoxy, to stick the frame and a chip together, and forming at least one pad and leads on the surface of one side of the chip, and further covering part of each lead by liquid compound that the exposed (uncovered) part of leads can be available for convenient electrical connection.

Among the features of the invention are that the pad is helpful in forming leads and conducting heat from chip to printed circuit board, and that the length of exposed leads can be controlled to avoid short circuiting resulting from bent shape.

BRIEF DESCRIPTION OF THE DRAWINGS

FIG. 2 and FIG. 3 include frame 20 while FIG. 4 doesn't.

REFERENCE NUMERALS (SYMBOLS) LIST

Figure 1:
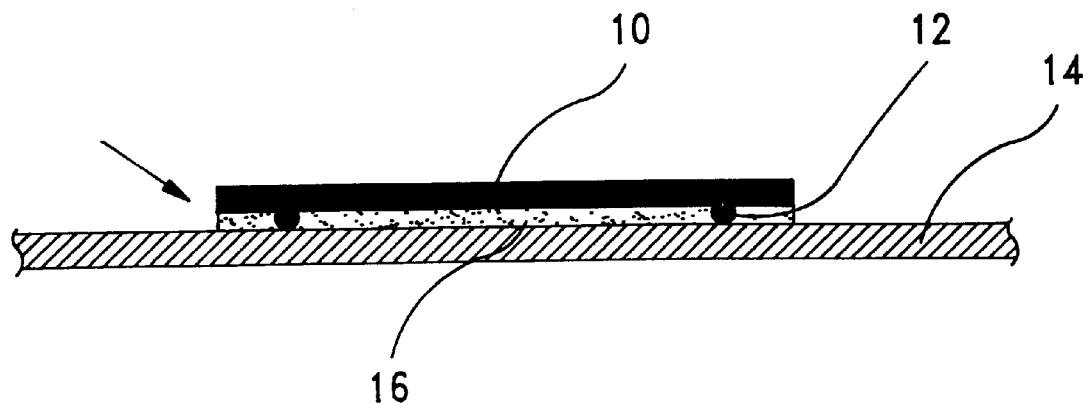
FIG. 1 shows a conventional flip chip package.

10 IC chip
12 connection point
14 printed circuit board
16 under-fill
18 silver filled epoxy
20 frame
22 pad
24 lead
26 liquid compound
28 ball lead
30 pad
32 lead
34 liquid compound
36 ball lead

DETAILED DESCRIPTION OF PREFERRED EMBODIMENTS

Figure 2:
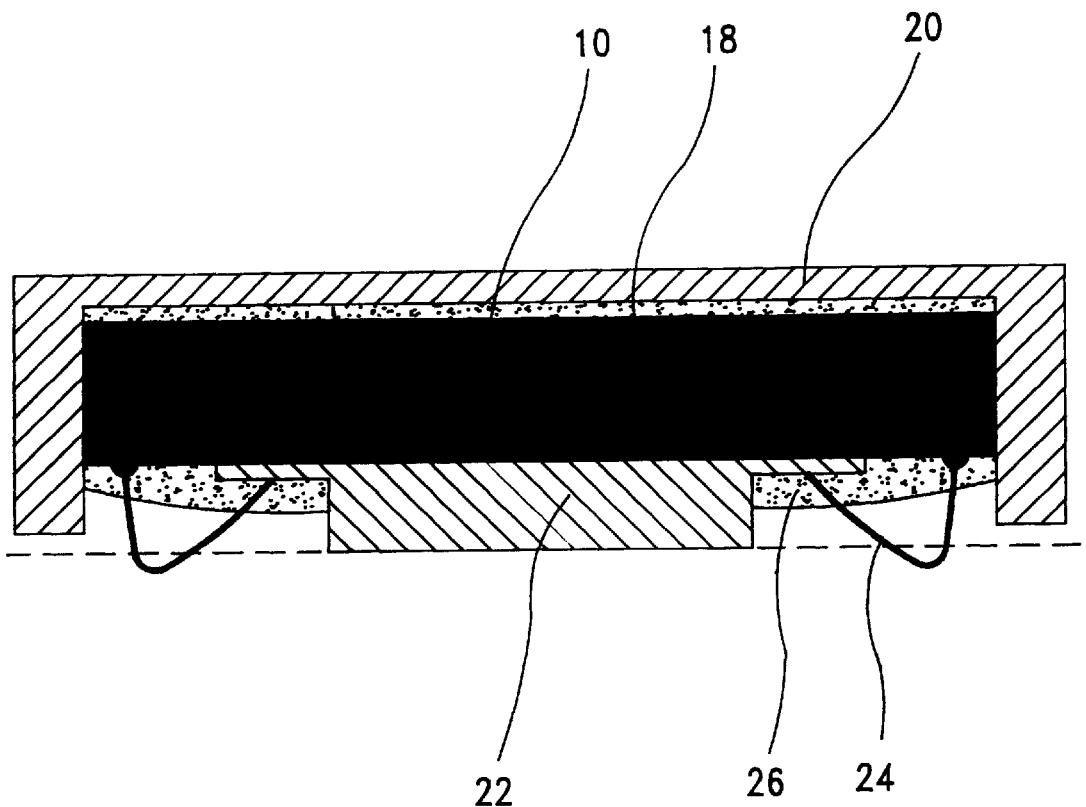
FIGS. 2 to 4 show embodiments based on the present invention and applied to peripherally configured leads.

A preferred embodiment of the flip chip package based on the invention is illustrated by FIG. 2, in which one side of chip 10 is stuck to the inside of frame 20 by using silver filled epoxy 18, another side of chip 10 is attached with pad 22, two terminals of lead 24 are respectively connected with pad 22 and a connection point on the surface of chip 10, then the surface of the side of chip 10 where the leads extend is covered by liquid compound 26, with part of each lead exposed beyond liquid compound 26.

Among the processes to form such a flip chip package are: painting the silver filled epoxy 18 inside frame 20, sticking chip 10 to the painted surface of frame 20, sticking pad 22 on the exposed surface of chip 10, forming lead 24 by wire bonding, setting up liquid compound 26 by spotting scheme.

The preferred material for forming lead 24 is gold wire with a curve unnecessarily accurate and with diameter properly small.

The preferred material for forming globe top 26 is epoxy which is conducted through pad 22 when proceeding the process of spotting. For example, slot structure on pad 22 (not shown in figure) can provide path for epoxy to flow to the surface of chip 10 after the epoxy is spotted on pad 22.

In such a structure, frame 20 is mainly for preventing chip 10 from being broken by external force, and also for helping chip 10 to dissipate heat. Preferably frame 20 is made of metal to achieve better heat dissipation. Furthermore another device for promoting heat dissipation may be seated on the top of frame 20.

The pad 22 performs two functions: one is to fix a terminal of lead 24 for enabling the easier application of wire bonding, another is to help conducting heat from chip 10 to printed circuit board. Preferably pad 22 is made of material such as metal, with insulation process done on part of its surface. Ceramics with nice thermal conductivity is also a good choice to make pad 22.

The length of exposed lead 24 is determined by the thickness of liquid compound 26 (or the quantity of material spotted to form globe top 26), and hence can be so controlled that the short circuiting due to the bent shape caused in integrating with printed circuit board may be avoided. It can be seen that liquid compound 26 contributes to fixing lead 24 as well as controlling the length of exposed lead 24. The formation of such a structure doesn't require accurate operation (because the length of exposed lead 24 is not necessarily fixed as long as the exposed leads may not touch each other), resulting in easier implementation of forming the structure and of its following processes.

While the height of the part of frame 20 and that of the part of pad 22 which extends beyond the surface of chip 10 is not important, the exposed lead 24 must be configured to extend beyond the surface of both frame 20 and pad 22, in order to easily proceed the welding operation of lead 24 whenever necessary.

Figure 3:
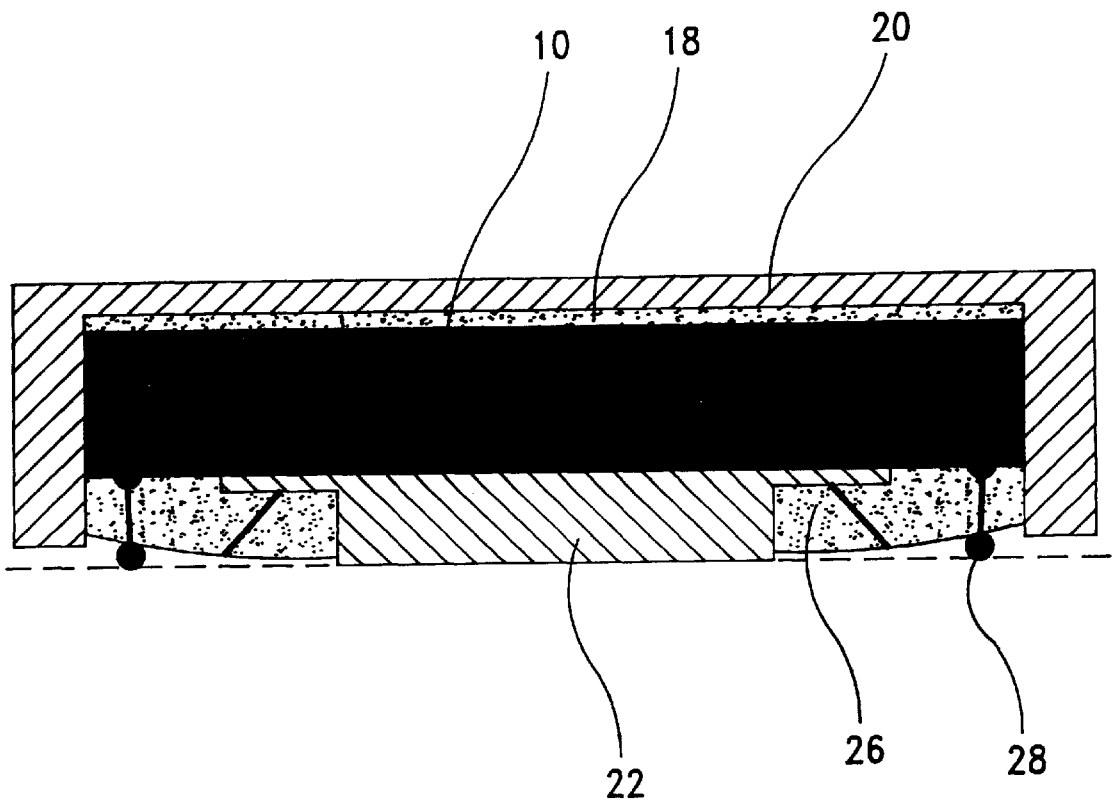

Shown in FIG. 3 is another embodiment in which the structure and manufacturing process is almost the same as previous embodiment except that the gold wire which is formed as lead 24 in the previous embodiment is, in this embodiment, cut and then burned by hydrogen-oxygen flames after forming globe top 26, to naturally form ball lead 28. The application of hydrogen-oxygen flames is existing in the present manufacturing process and hence no extra processing step is required.

Another scheme to implement such a structure is that the terminal of the gold wire to be supposedly connected to pad 22 firmly is connected to pad 22 loosely instead, thereby the terminal connected loosely to pad 22 can be pulled out as a free (floating) terminal and then burned by hydrogen-oxygen flames to form ball lead 28 which is in ball shape.

Figure 4:
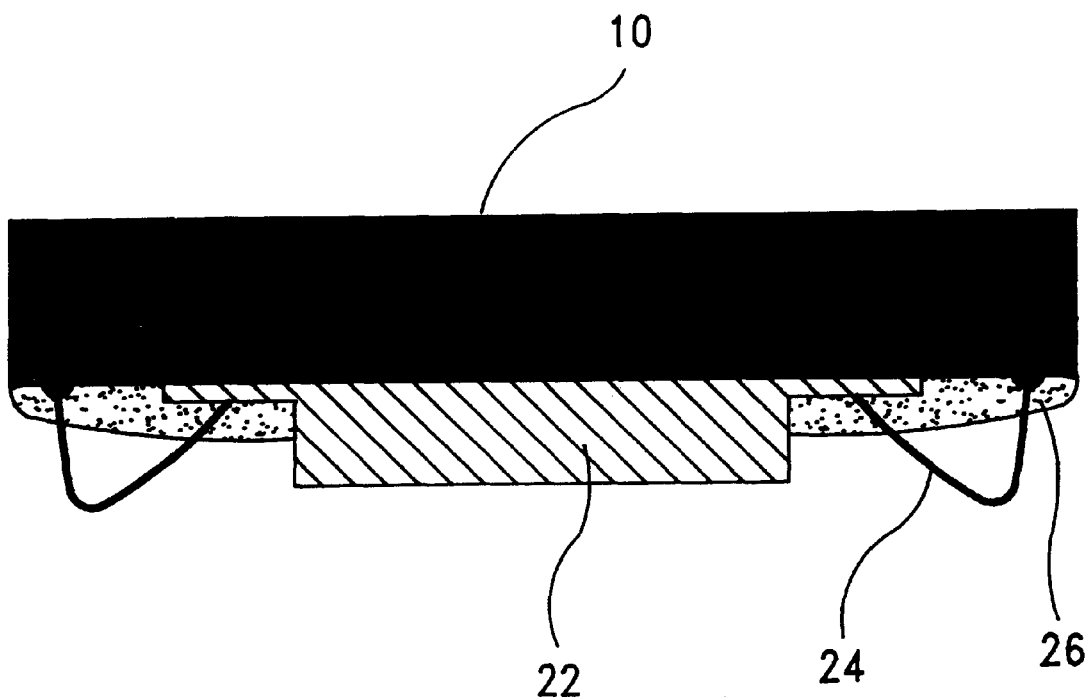

The above two embodiments include frame 20 while the embodiment in FIG. 4 doesn't. The structure and manufacturing process for the embodiment in FIG. 4 are the same as the embodiment in FIG. 2 except that it requires no step of sticking frame 20.

Figure 5:
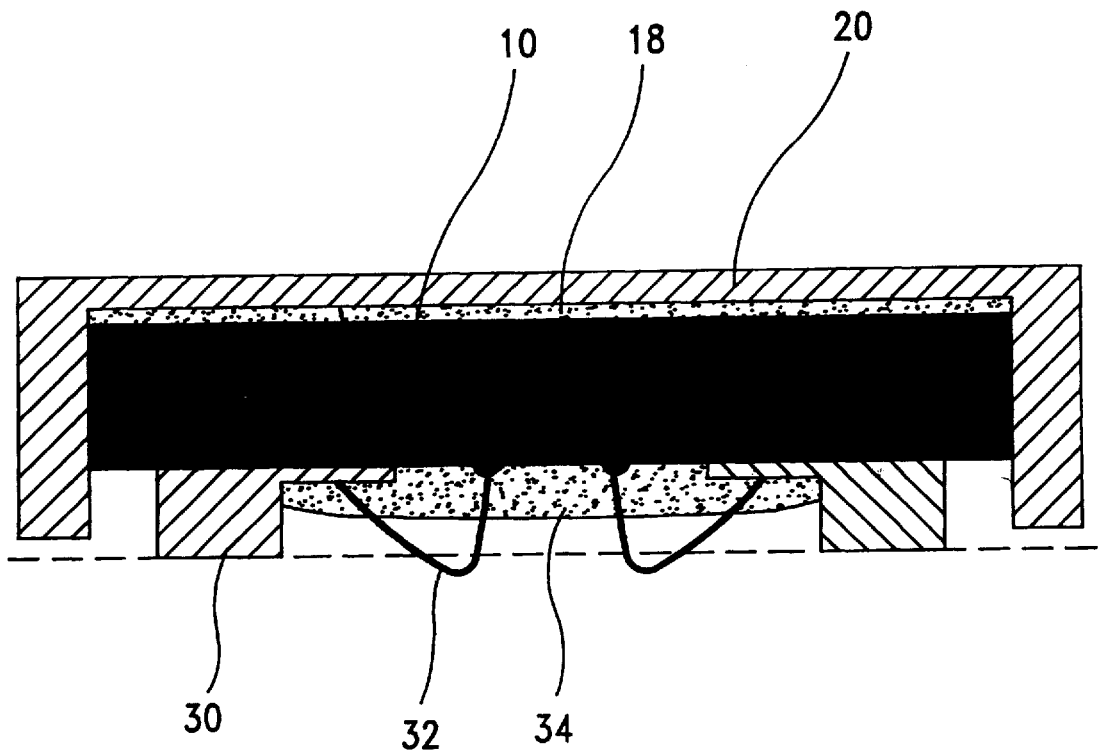
FIG. 5 and FIG. 6 shows embodiments based on the present invention and applied to leads configured centrally (relative to those configured peripherally).
Figure 6:
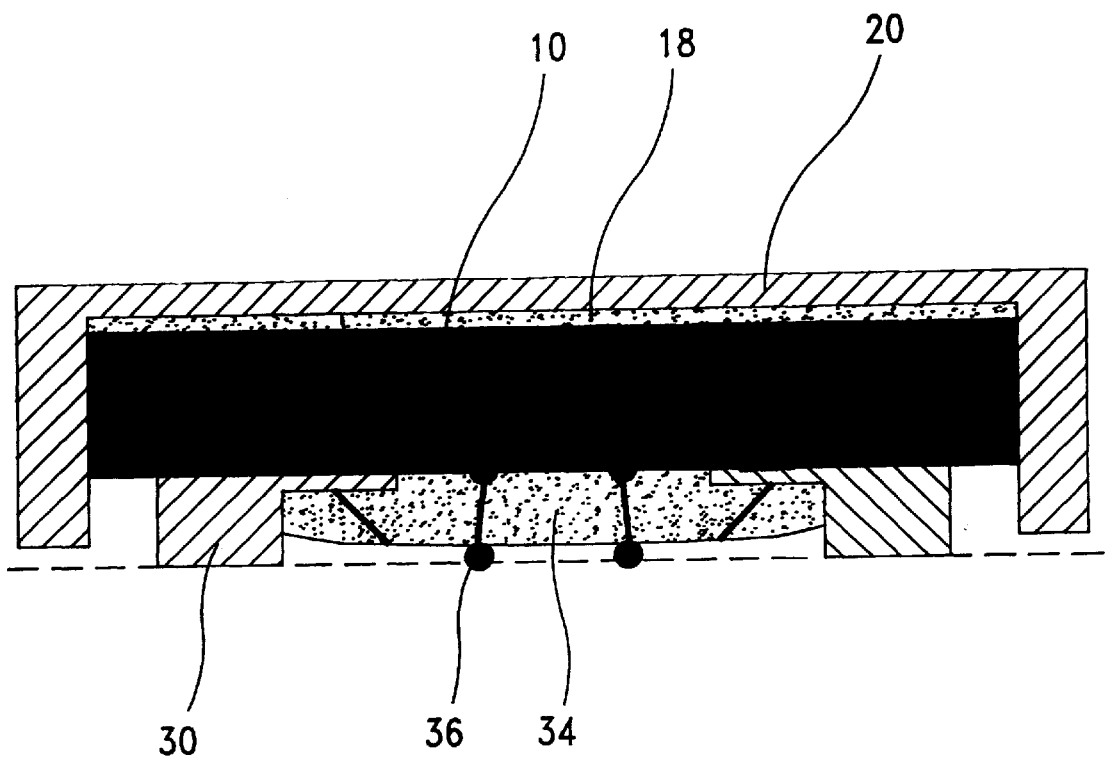

FIG. 5 and FIG. 6, respectively corresponding to FIG. 2 and FIG. 3, show the other two embodiments of leads configured in a central style (centrally configured), i.e; configured in the central part, indicating a contrast to those configured peripherally as shown in FIG. 2 and FIG. 3. The centrally configured lead 32 and ball lead 36 are seated in central part, and thereby their outer parts are surrounded by pad 30. Only inner part of lead 32 and ball lead 36 need to be covered by liquid compound.

Figure 7:
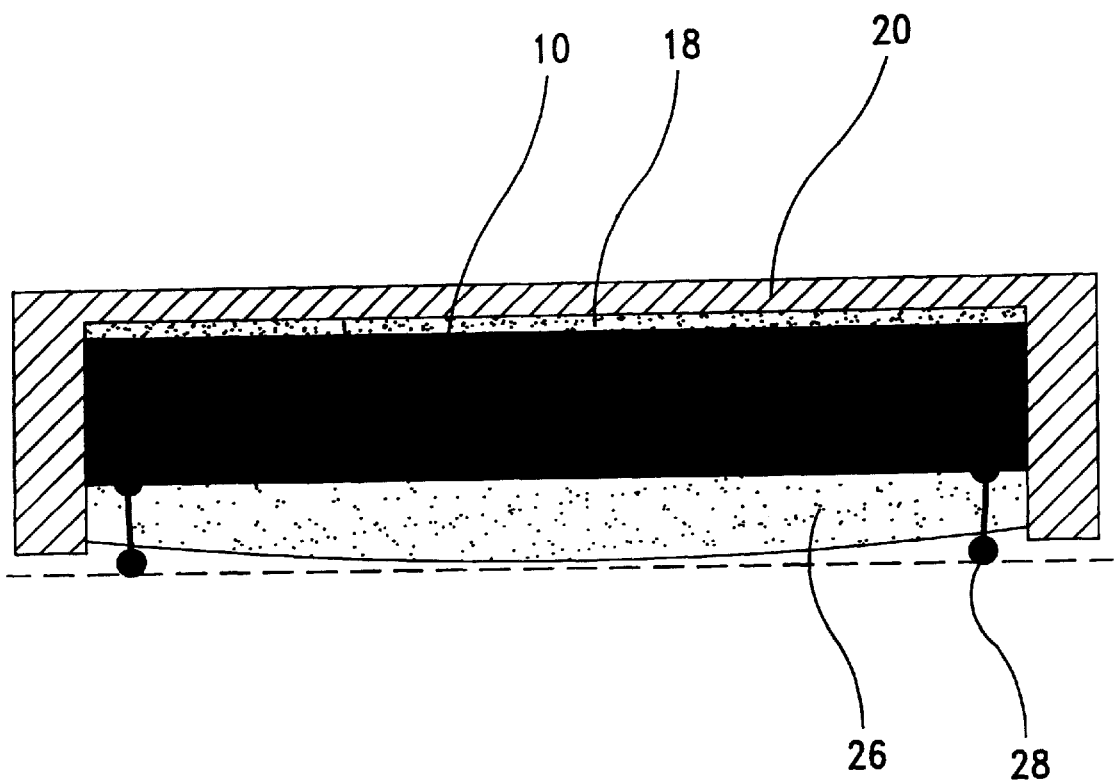
FIG. 7 is a further embodiment based on the present invention, in which leads with exposed terminals are formed by wire bonding for convenient connection.

FIG. 7 shows a further embodiment in which BIP (bonded Interconnect Pin) technology instead of the wire bonding adopted in the above embodiments is used to form its structure. Here lead 28 is formed through the following steps: bonding a terminal of a gold wire to chip 10 and then cutting it out to have a free (floating) terminal, liquid compound 26 is spread to cover the chip and part of the gold wire afterwards. It can be seen liquid compound 26 functions to protect the wire of ball lead 28 and control the exposed wire length to form the ball terminal of ball lead 28.

As can be understood from the above embodiments, setting pad 22 before forming ball lead 28 may realize another further embodiment with overall performance promoted. There's no need of further description for it.

It is clear now that the technology suggested by the invention can realize combination of simplicity of wire bonding and the advantage of flip chip structure such as its packaging density.

While the invention has been described in terms of what are presently considered to be the most practical and preferred embodiments, it is to be understood that the invention is not limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A flip chip package for packaging an IC chip, comprising:

at least one pad coupled to a surface of a first side of said IC chip;

at least one wire bonding lead having a first end connected to said surface of said first side of said IC chip, an opposing second end connected to said at least one pad, and an arcuate portion of said at least one wire bonding lead disposed intermediate said first and second ends and extending outwardly from said surface of said first side of said IC chip; and, a compound applied as a liquid and overlaying said connection of said first end of said wire bonding lead to said IC chip and said connection of said second end of said wire bonding lead to said pad to form a rounded top covering therefor, said arcuate portion of said wire bonding lead being exposed beyond a surface of said rounded top of said compound for electrical connection to an external circuit.

2. The flip chip pachage according to claim 1 further comprising a frame adhered to a second side of said IC chip with a silver filled epoxy.

3. The flip chip package according to claim 1 wherein said pad is made of metal with a surface thereof processed to form an insulation thereon.

4. The flip chip package according to claim 1 wherein said pad is formed of a material having a good thermal conductivity.

5. The flip chip package according to claim 1 further comprising a plurality of wire bonding leads respectively connected to a plurality of connection positions of said first side of said IC chip, said pad being disposed in a central portion of said first surface of said IC chip, said plurality of connecting positions surrounding a periphery of said pad.

6. The flip chip package according to claim 1 wherein said at least one wire bonding lead is connected to a central portion of said surface of said first side of said IC chip, said pad surrounding said central portion.

7. A flip chip package for packaging an IC chip, comprising:
   at least one wire bonding lead having a first end coupled to a surface of a first side of said IC chip, a second end of said wire bonding lead extending from said surface and having a ball-shaped second end; and,
   a compound applied as a liquid and covering a portion of said wire bonding lead adjacent said first end thereof, said ball-shaped second end of said wire bonding lead being exposed beyond an outer surface of said compound for electrical connection to an external circuit.

8. The flip chip package according to claim 7 further comprising at least one pad coupled to said surface of said first side of said IC chip.

9. The flip chip package according to claim 8 wherein said pad is formed of a material having a good thermal conductivity.

10. The flip chip package according to claim 9 wherein said pad is made of metal.

11. The flip chip package according to claim 7 further comprising a frame adhered to a second side of said IC chip with a silver filled epoxy.

* * * * *